(12) United States Patent
Ueda et al.

(10) Patent No.: US 10,160,881 B2
(45) Date of Patent: Dec. 25, 2018

(54) CURABLE COMPOSITION FOR INKJET AND METHOD FOR PRODUCING ELECTRONIC COMPONENT

(75) Inventors: Michihisa Ueda, Osaka (JP); Takashi Watanabe, Osaka (JP); Shigeru Nakamura, Osaka (JP); Shuuji Kage, Osaka (JP); Toshio Takahashi, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 487 days.

(21) Appl. No.: 13/825,535

(22) PCT Filed: Sep. 20, 2011

(86) PCT No.: PCT/JP2011/071327
§ 371 (c)(1),
(2), (4) Date: May 7, 2013

(87) PCT Pub. No.: WO2012/039272
PCT Pub. Date: Mar. 29, 2012

(65) Prior Publication Data
US 2013/0216726 A1    Aug. 22, 2013

(30) Foreign Application Priority Data

Sep. 24, 2010  (JP) ................................ 2010-214252
Jan. 27, 2011  (JP) ................................ 2011-015307

(51) Int. Cl.
| C09D 163/00 | (2006.01) |
| B41M 3/00 | (2006.01) |
| C08L 63/00 | (2006.01) |
| H05K 3/28 | (2006.01) |
| C08G 59/40 | (2006.01) |
| C09D 11/101 | (2014.01) |
| H01L 31/05 | (2014.01) |
| C09D 11/30 | (2014.01) |

(52) U.S. Cl.
CPC .......... *C09D 163/00* (2013.01); *B41M 3/006* (2013.01); *C08G 59/4021* (2013.01); *C08L 63/00* (2013.01); *C09D 11/101* (2013.01); *C09D 11/30* (2013.01); *H01L 31/0516* (2013.01); *H05K 3/285* (2013.01); *H05K 2203/013* (2013.01); *Y02E 10/50* (2013.01)

(58) Field of Classification Search
CPC .. B41M 5/0023; B41M 7/009; B41M 7/0072; C09D 11/101; C09D 11/30; C09D 163/00; C08G 59/4021; H05K 3/3452; H05K 3/125; H05K 2203/013
USPC ......................................................... 427/508
See application file for complete search history.

(56) References Cited

U.S. PATENT DOCUMENTS

| 7,462,653 | B2 * | 12/2008 | Kakinuma ........... C09D 11/101 |
| | | | 430/269 |
| 2001/0029868 | A1 | 10/2001 | Kubota et al. |
| 2002/0137818 | A1 | 9/2002 | Yu et al. |
| 2003/0043245 | A1 | 3/2003 | Yamashita |
| 2005/0165135 | A1 | 7/2005 | Mozel et al. |
| 2006/0058412 | A1 | 3/2006 | Kakinuma et al. |
| 2008/0103280 | A1 * | 5/2008 | Satou .................... C08G 77/045 |
| | | | 528/26 |
| 2009/0163615 | A1 | 6/2009 | Halahmi et al. |
| 2013/0208064 | A1 | 8/2013 | Ueda et al. |

FOREIGN PATENT DOCUMENTS

| CN | 1485356 A | 3/2004 |
| EP | 1 624 001 A1 | 2/2006 |
| JP | 59-126428 A | 7/1984 |
| JP | 63-205313 A | 8/1988 |
| JP | 2-283718 A | 11/1990 |
| JP | 5-78454 A | 3/1993 |
| JP | 6-55806 B2 | 7/1994 |
| JP | 2000-53896 A | 2/2000 |
| JP | 2000-239418 A | 9/2000 |
| JP | 2001-240782 A | 9/2001 |
| JP | 2002-232148 A * | 8/2002 ............... H05K 3/46 |
| JP | 2002-331739 A | 11/2002 |
| JP | 2004-34545 A | 2/2004 |
| JP | 2005-60520 A | 3/2005 |
| JP | 2005-68280 A | 3/2005 |
| JP | 2005-165294 A | 6/2005 |
| JP | 2005-255793 A | 9/2005 |

(Continued)

OTHER PUBLICATIONS

Translation of the abstract of JP 63-205313.*
Translation of the disclosure and claims of JP 2002-232148.*
Notification of Reasons for Refusal for the Application No. 2011-539831 from Japan Patent Office dated Jan. 7, 2014.
International Search Report for the Application No. PCT/JP2011/071327 dated Dec. 27, 2011.
Written Opinion of the International Searching Authority (PCT/ISA/237) for the Application No. PCT/JP2011/071327 dated Dec. 27, 2011.
Supplementary European Search Report for the Application No. EP 11 82 6817 dated Feb. 26, 2014.

(Continued)

*Primary Examiner* — Robert S Walters, Jr.
(74) *Attorney, Agent, or Firm* — Cheng Law Group, PLLC

(57) ABSTRACT

Provided is a curable composition for inkjet applied by an inkjet method, that has a long pot life even in the environment in an inkjet device warmed to 50° C. or higher and excellent insulation reliability by the cured product after curing despite containing a compound having a cyclic ether group. The composition for inkjet according to the present invention is applied by an inkjet method, and cures by heat addition, the composition for inkjet according to the present invention contains a compound having a cyclic ether group and a curing agent, and the curing agent is a reaction viscous product obtained by reacting dicyandiamide with a functional group-containing compound having a functional group reactive with the dicyandiamide.

16 Claims, No Drawings

(56) References Cited

FOREIGN PATENT DOCUMENTS

| | | |
|---|---|---|
| JP | 2005-330482 A | 12/2005 |
| JP | 2006-117389 A | 5/2006 |
| JP | 2007-161823 A | 6/2007 |
| JP | 2007-304355 A | 11/2007 |
| JP | 2008-166451 A | 7/2008 |
| JP | 2009-506187 A | 2/2009 |
| JP | 2009-216790 A | 9/2009 |
| JP | 2009-285854 A | 12/2009 |
| JP | 2010-111716 A | 5/2010 |
| JP | 2010-143982 A | 7/2010 |
| JP | 2011-21079 A | 2/2011 |
| JP | 2011-26403 A | 2/2011 |
| JP | 2012-87284 A | 5/2012 |
| JP | 2012-136681 A | 7/2012 |
| JP | 2013-193127 | 9/2013 |
| JP | 2014-153598 A | 9/2014 |
| TW | 201024380 A1 | 7/2010 |
| WO | WO-2004/099272 A1 | 11/2004 |
| WO | WO-2012/039379 A1 | 3/2012 |

OTHER PUBLICATIONS

European Office Action for the Application No. 11 826 817.6 dated Feb. 11, 2015.
Notification of Reasons for Refusal for the Application No. 2031-004536 from Japan Patent Office dated Mar. 24, 2015.
Notification of Reasons for Refusal for the Application No. 2014-153035 from Japan Patent Office dated May 12, 2015.
Written Opinion of the International Searching Authority (PCT/ISA/237) for the Application No. PCT/JP2011/071327 dated Dec. 27, 2011 (English Translation dated Apr. 25, 2013).
Notification of Reasons for Refusal for the Application No. 2014-14737 from Japan Patent Office dated Jun. 30, 2015.
The First Office Action for the Application No. 201180009526.0 from the State Intellectual Property Office of the People's Republic of China dated Oct. 21, 2013.

* cited by examiner

CURABLE COMPOSITION FOR INKJET AND METHOD FOR PRODUCING ELECTRONIC COMPONENT

TECHNICAL FIELD

The present invention relates to a curable composition for inkjet that is applied by an inkjet method, and desirably used for forming a cured product layer such as a resist pattern on a substrate, and a method for producing an electronic component having a cured product layer formed by the curable composition for inkjet.

BACKGROUND ART

Conventionally, a printed wiring board in which a solder resist pattern which is a patterned solder resist film is formed on a substrate having a wiring provided on its top face is widely used. As electronic devices become smaller and densified, a still finer solder resist pattern is demanded in a printed wiring board.

As a method for forming a fine solder resist pattern, a method of applying a composition for solder resist by an inkjet method is proposed. In the inkjet method, the number of steps is reduced in comparison with the case of forming a solder resist pattern by a screen printing method. Therefore, in the inkjet method, it is possible to form a solder resist pattern easily and efficiently.

In the case of applying a composition for solder resist by an inkjet method, the composition is required to have a somewhat low viscosity at the time of application. On the other hand, an inkjet device capable of printing while being warmed at 50° C. or higher is developed. By warming a composition for solder resist to 50° C. or higher in the inkjet device, the composition for solder resist get relatively low viscosity, and dischargeability of the composition for solder resist by the inkjet device would be further improved.

Further, a composition for solder resist that can be applied by an inkjet method is disclosed in the following Patent document 1. In the following Patent Document 1, a curable composition for inkjet including a monomer having a (meth) acryloyl group and a heat-curable functional group, a photoreactive diluent having a weight average molecular weight of 700 or less, and a photopolymerization initiator is disclosed. The curable composition for inkjet has a viscosity at 25° C. of 150 mPa·s or less.

PRIOR ART DOCUMENT

Patent Document

Patent Document 1: WO2004/099272A1

SUMMARY OF THE INVENTION

Problems to be Solved by the Invention

The curable composition for inkjet described in Patent Document 1 has a relatively low viscosity. Therefore, the curable composition for inkjet described in Patent Document 1 can be applied on a substrate by an inkjet method.

However, since the curable composition for inkjet described in Patent Document 1 contains a monomer having a (meth)acryloyl group and a heat-curable functional group, it has a problem of short pot life in the environment of 50° C. or higher.

For example, when a curable composition for inkjet is discharged by an inkjet device, in general, the curable composition for inkjet remains in the inkjet device for a certain time after being supplied into the inkjet device. On the other hand, the temperature in the inkjet device is sometimes warmed to 50° C. or higher for improving the dischargeability. In the curable composition for inkjet described in Patent Document 1, the viscosity of the composition increases by the progress of curing of the composition in the inkjet device warmed to 50° C. or higher, and the composition may become difficult to be discharged.

Further, the conventional curable composition for inkjet faces a problem of low heat resistance and insulation reliability of the cured product after curing.

It is an object of the present invention to provide a curable composition for inkjet that is a curable composition applied by an inkjet method, having a long pot life even in the environment in an inkjet device warmed to 50° C. or higher despite containing a compound having a cyclic ether, and realizing excellent insulation reliability by the cured product after curing, and a method for producing an electronic component using the curable composition for inkjet.

It is another object of the present invention to provide a curable composition for inkjet giving a cured product having excellent heat resistance after curing, and a method for producing an electronic component using the curable composition for inkjet.

Means for Solving the Problems

According to a broad aspect of the present invention, there is provided a curable composition for inkjet that is applied by an inkjet method, and curable by heat addition, and contains a compound having a cyclic ether group and a curing agent, and the curing agent is a reaction viscous product obtained by reacting dicyandiamide with a functional group-containing compound having a functional group capable of reacting with the dicyandiamide.

The functional group-containing compound that reacts with the dicyandiamide preferably has at least one functional group selected from the group consisting of a hydroxyl group, a cyclic ether group, a carboxyl group and an isocyanate group.

The functional group-containing compound that reacts with the dicyandiamide is preferably a compound having an epoxy group. The compound having an epoxy group that reacts with the dicyandiamide preferably has one epoxy group. The functional group-containing compound that reacts with the dicyandiamide preferably has an aromatic backbone. The reaction viscous product is preferably a reaction viscous product obtained by reacting 1 mol or more and 3 mol or less of the functional group-containing compound with 1 mol of dicyandiamide.

In a certain specific aspect of the curable composition for inkjet according to the present invention, the dicyandiamide reacted with the functional group-containing compound is powdered state.

In another specific aspect of the curable composition for inkjet according to the present invention, the reaction viscous product is dissolved in the curable composition.

Other specific aspect of the curable composition for inkjet according to the present invention is a curable composition for inkjet that is applied by an inkjet method, and is curable by light irradiation and heat addition, and it further includes a polyfunctional compound having two or more (meth) acryloyl groups and a photopolymerization initiator.

The photopolymerization initiator is preferably an α-aminoalkylphenone type photoradical polymerization initiator. The photopolymerization initiator is preferably an α-aminoalkylphenone type photoradical polymerization initiator having a dimethyl amino group.

In other specific aspect of the curable composition for inkjet according to the present invention, the multifunctional compound having two or more (meth)acryloyl groups is a multifunctional compound having a polycyclic backbone and having two or more (meth)acryloyl groups.

In a still another specific aspect of the curable composition for inkjet according to the present invention, a monofunctional compound having a polycyclic backbone and having one (meth)acryloyl group is further included.

In other specific aspect of the curable composition for inkjet according to the present invention, the multifunctional compound having two or more (meth)acryloyl groups is a multifunctional compound having a polycyclic backbone and having two or more (meth)acryloyl groups, and a monofunctional compound having a polycyclic backbone and having one (meth)acryloyl group is further included.

In another specific aspect of the curable composition for inkjet according to the present invention, in a total of 100% by weight of the polyfunctional compound, the monofunctional compound and the photopolymerization initiator, the content of the polyfunctional compound is 20% by weight or more and 70% by weight or less, and the content of the monofunctional compound is 5% by weight or more and 50% by weight or less.

The monofunctional compound is preferably at least one selected from the group consisting of isobornyl (meth)acrylate, dihydroxycyclopentadienyl (meth)acrylate, dicyclopentenyl (meth)acrylate, dicyclopentenyloxyethyl (meth)acrylate and dicyclopentanyl (meth)acrylate. The polyfunctional compound is preferably tricyclodecane dimethanol di(meth)acrylate.

The reaction viscous product is preferably a reaction product obtained by reacting the functional group of the functional group-containing compound with part of active hydrogen in dicyandiamide.

In the curable composition for inkjet according to the present invention, the viscosity at 25° C. measured in conformance with JIS K2283 is preferably 160 mPa·s or more and 1200 mPa·s or less.

Further, according to a broad aspect of the present invention, there is provided a method for producing an electronic component including the steps of applying a curable composition for inkjet produced according to the present invention to draw a pattern by an inkjet method, and making the curable composition for inkjet drawn into a pattern cure by heat addition, to form a cured product layer.

One specific aspect of the method for producing an electronic component according to the present invention is a method for producing a printed wiring board which is an electronic component having a resist pattern, wherein the curable composition for inkjet is applied to draw a pattern by an inkjet method, and the curable composition for inkjet drawn into a pattern is made to cure by heat addition, to form a resist pattern.

In other specific aspect of the method for producing an electronic component according to the present invention, a curable composition for inkjet containing a multifunctional compound having two or more (meth)acryloyl groups and a photopolymerization initiator is used as the curable composition for inkjet, and in the step of forming the cured product layer, the curable composition for inkjet drawn into a pattern is made to cure by light irradiation and heat addition to form a cured product layer.

Effect of the Invention

Since the curable composition for inkjet according to the present invention contains a compound having a cyclic ether group and a curing agent, and further the curing agent is a reaction viscous product obtained by reacting dicyandiamide with a functional group-containing compound having a functional group capable of reacting with the dicyandiamide, it can be applied by an inkjet method.

Further, since the curable composition for inkjet according to the present invention includes the aforementioned composition, and in particular, the curing agent is the aforementioned specific reaction viscous product, the pot life is sufficiently long even in the environment in an inkjet device warmed to 50° C. or higher. Further, since a compound having a cyclic ether group is contained, heat resistance of the cured product is high. Further, since the curing agent is the aforementioned specific reaction viscous product, insulation reliability by the cured product is improved.

MODE(S) FOR CARRYING OUT THE INVENTION

In the following, details of the present invention will be described.

(Curable Composition for Inkjet)

The curable composition for inkjet according to the present invention contains a compound having a cyclic ether group (C) and a curing agent (D). Preferably, the curable composition for inkjet according to the present invention further contains a multifunctional compound having two or more (meth)acryloyl groups (A) and a photopolymerization initiator (B). The curing agent (D) is a reaction viscous product obtained by reacting dicyandiamide with a functional group-containing compound having a functional group capable of reacting with the dicyandiamide. The term "(meth)acryloyl group" indicates an acryloyl group and a methacryloyl group.

Since the curable composition for inkjet according to the present invention contains the compound having a cyclic ether group (C) and the curing agent (D), it is able to cure by heat addition. Therefore, the curable composition for inkjet according to the present invention is a heat-curable composition for inkjet. When the curable composition for inkjet according to the present invention contains the polyfunctional compound (A) and the photopolymerization initiator (B), the curable composition for inkjet according to the present invention is curable by light irradiation and heat addition, and is a photo- and heat-curable composition for inkjet.

The curable composition for inkjet according to the present invention can be made to cure by heat addition, and a cured product layer such as a resist pattern which is a cured product can be obtained. When the curable composition for inkjet according to the present invention contains the polyfunctional compound (A) and the photopolymerization initiator (B), after obtaining a primary cured product by light irradiation, the primary cured product may be made to really cure by heat addition, and thus a cured product layer such as a resist pattern which is a cured product can be obtained. By conducting primary curing by light irradiation in the manner as described above, it is possible to prevent the curable composition for inkjet that is applied on an application objective member such as substrate from wet-spreading. Therefore, it is possible to form a cured product layer such as fine resist pattern with high accuracy.

Since the curable composition for inkjet according to the present invention contains the compound having a cyclic ether group (C) and the curing agent (D), and further the curing agent (D) is the aforementioned reaction viscous product, it is possible to make the pot life sufficiently long even in the environment in an inkjet device warmed to 50° C. or higher even though the compound having a cyclic ether group (C) and the curing agent (D) are contained. Also, the curable composition for inkjet before application by an inkjet method is less likely to have elevation in viscosity and progress of heat curing even when it is warmed to 50° C. or higher. Therefore, the curable composition for inkjet is excellent in stability under high temperature, and can be discharged stably through an inkjet nozzle. Therefore, it is possible to form a uniform cured product layer such as a resist pattern.

On the other hand, when dicyandiamide that is not the aforementioned reaction viscous product is used, dicyandiamide is not compatible to other ingredient (excluding solids, if contained) in the curable composition because it is solid at normal temperature (23° C.). That is, dicyandiamide that is not the aforementioned reaction viscous product exists in solid in the curable composition, and is not dissolved in the curable composition. Therefore, when the conventional dicyandiamide is used as a curing agent, clogging occurs in an inkjet head when a curable composition is discharged by an inkjet method. Clogging will make discharging difficult or impossible, or make the cured product layer such as a resist pattern non-uniform. Even when the dicyandiamide is finely ground into such a size that is dischargeable by inkjet, breakdown originating from the ground matter occurs due to hydrophilicity (water absorptivity) of the ground matter, and the reliability tends to decrease.

Further, since the curable composition for inkjet according to the present invention contains, in particular, the compound having a cyclic ether group (C), it is possible to improve heat resistance of the cured product after curing.

Further, in the curable composition for inkjet according to the present invention, since the curing agent (D) is the aforementioned reaction viscous product, in particular, it is also possible to improve the insulation reliability by the cured product after curing. The inventors of the present invention found that insulation reliability by the cured product after curing is improved when the curable composition for inkjet according to the present invention has the aforementioned composition, and in particular, when the curing agent (D) is the aforementioned reaction viscous product. For example, when the aforementioned reaction viscous product including dicyandiamide is used, insulation reliability by the cured product is significantly improved in comparison with the case where an imidazole curing agent or the like is used.

In the following, details of ingredients contained in the curable composition for inkjet according to the present invention will be described.

[Multi-functional Compound (A)]

For making the curable composition cure by light irradiation, the curable composition for inkjet according to the present invention preferably contains a multifunctional compound having two or more (meth)acryloyl groups (A). The multi-functional compound (A) is not particularly limited as far as it has two or more (meth)acryloyl groups. As the polyfunctional compound (A), a conventionally known polyfunctional compound having two or more (meth)acryloyl groups may be used. Since the polyfunctional compound (A) has two or more (meth)acryloyl groups, it cures as polymerization proceeds by light irradiation. Therefore, it is possible to make curing proceed by irradiating with light after application of the curable composition, to keep the applied shape, and to effectively prevent the primary cured product and the cured product of the curable composition irradiated with the light from excessively wet spreading. The multi-functional compound (A) may be used singly or in combination of two or more kinds.

Examples of the polyfunctional compound (A) include (meth)acrylic acid adducts of polyhydric alcohol, (meth)acrylic acid adducts of alkylene oxide-modified polyhydric alcohol, urethane (meth)acrylates, and polyester (meth)acrylates. Examples of the polyhydric alcohol include diethylene glycol, triethylene glycol, polyethylene glycol, dipropylene glycol, tripropylene glycol, polypropylene glycol, trimethylolpropane, cyclohexanedimethanol, tricyclodecane dimethanol, alkyleneoxide adduct of bisphenol A, and pentaerythritol. The term "(meth)acrylate" indicates acrylate and methacrylate. The term "(meth)acryl" indicates acryl and methacryl.

Preferably, the polyfunctional compound (A) is a multifunctional compound having a polycyclic backbone and having two or more (meth)acryloyl groups (A1). By using the polyfunctional compound (A1), it is possible to improve the moist heat resistance of the cured product of the curable composition for inkjet. Therefore, it is possible to use the printed wiring board applied the curable composition for inkjet according to the present invention for a long time, and to improve the reliability of the printed wiring board.

Multi-functional compound (A1) is not particularly limited as far as it has a polycyclic backbone and has two or more (meth)acryloyl groups. As the polyfunctional compound (A1), a conventionally known polyfunctional compound having a polycyclic backbone and having two or more (meth)acryloyl groups may be used. Since the polyfunctional compound (A1) has two or more (meth)acryloyl groups, its polymerization proceeds by light irradiation and it cures. The multi-functional compound (A1) may be used singly or in combination of two or more kinds.

Examples of the polyfunctional compound (A1) include (meth)acrylic acid adducts of polyhydric alcohol, (meth)acrylic acid adducts of alkylene oxide-modified polyhydric alcohol, urethane (meth)acrylates, and polyester (meth)acrylates. Examples of the polyhydric alcohol include diethylene glycol, triethylene glycol, polyethylene glycol, dipropylene glycol, tripropylene glycol, polypropylene glycol, trimethylolpropane, and pentaerythritol.

Concrete examples of the polyfunctional compound (A1) include tricyclodecanedimethanol di(meth)acrylate, isobornyldimethanol di(meth)acrylate and dicyclopentenyldimethanol di(meth)acrylate. Among these, the polyfunctional compound (A1) is preferably tricyclodecanedimethanol di(meth)acrylate from the view point of further improving moist heat resistance of the cured product. The term "(meth)acrylate" indicates acrylate and methacrylate.

The "polycyclic backbone" in the polyfunctional compound (A1) and a monofunctional compound (E) as will be described later indicates a structure sequentially having a plurality of cyclic backbones. As the polycyclic backbone in the polyfunctional compound (A1) and the monofunctional compound (E), polycyclic alicyclic backbone and polycyclic aromatic backbone and the like are respectively recited.

Examples of the polycyclic alicyclic backbone include bicycloalkane backbone, tricycloalkane backbone, tetracycloalkane backbone, and isobornyl backbone.

Examples of the polycyclic aromatic backbone include naphthalene ring backbone, anthracene ring backbone, phenanthrene ring backbone, tetracene ring backbone, chrysene ring backbone, triphenylene ring backbone, tetraphene ring backbone, pyrene ring backbone, pentacene ring backbone, picene ring backbone and perylene ring backbone.

The blending amount of the polyfunctional compound (A) is appropriately adjusted so that appropriate curing is achieved by light irradiation, and is not particularly limited. As one example of the blending amount of the polyfunctional compound (A), the content of the polyfunctional compound (A) in 100% by weight of the curable composition for inkjet is 0% by weight or more, preferably 20% by weight or more, more preferably 40% by weight or more, further preferably 60% by weight or more, preferably 95% by weight or less, and more preferably 90% by weight or less. In 100% by weight of the curable composition for inkjet, an upper limit of the content of the polyfunctional compound (A) is appropriately adjusted by contents of the ingredients (B) to (D) and other ingredients and the like.

When the polyfunctional compound (A1) and the monofunctional compound (E) as will be described later are used together, in a total of 100% by weight of the polyfunctional compound (A1), the monofunctional compound (E) and the photopolymerization initiator (B), the content of the polyfunctional compound (A1) is preferably 20% by weight or more and 70% by weight or less. In 100% by weight of the curable composition for inkjet, the content of the polyfunctional compound (A1) is more preferably 40% by weight or more and more preferably 60% by weight or less. When the content of the polyfunctional compound (A1) is more than or equal to the above lower limit, it is possible to make the curable composition cure more effectively by light irradiation. When the content of the polyfunctional compound (A1) is less than or equal to the above upper limit, moist heat resistance of the cured product is further improved.

[Photopolymerization Initiator (B)]

For curing of the curable composition by light irradiation, the curable composition for inkjet according to the present invention preferably contains a photopolymerization initiator (B) together with the polyfunctional compound (A). As the photopolymerization initiator (B), a photoradical polymerization initiator, a photocationic polymerization initiator and the like are recited. The photopolymerization initiator (B) is preferably a photoradical polymerization initiator. The photopolymerization initiator (B) may be used singly or in combination of two or more kinds.

The photoradical polymerization initiator is not particularly limited. The photoradical polymerization initiator is a compound that generates radical by light irradiation to initiate a radical polymerization reaction. Concrete examples of the photoradical polymerization initiator include benzoin, benzoin alkyl ethers, acetophenones, aminoacetophenones, anthraquinones, thioxanthones, ketals, 2,4,5-triarylimidazole dimer, riboflavin tetrabutylate, thiol compounds, 2,4,6-tris-s-triazine, organic halogen compounds, benzophenones, xanthones and 2,4,6-trimethylbenzoyldiphenylphosphine oxide. The photoradical polymerization initiator may be used singly or in combination of two or more kinds.

Examples of the benzoin alkyl ethers include benzoin methyl ether, benzoin ethyl ether and benzoin isopropyl ether. Examples of the acetophenones include acetophenone, 2,2-dimethoxy-2-phenylacetophenone, 2,2-diethoxy-2-phenylacetophenone and 1,1-dichloroacetophenone. Examples of the aminoacetophenones include 2-methyl-1-[4-(methylthio)phenyl]-2-morpholinopropane-1-one, 2-benzyl-2-dimethylamino-1-(4-morpholinophenyl)-butane-1-one and N,N-dimethylaminoacetophenone. Examples of the anthraquinones include 2-methylanthraquinone, 2-ethylanthraquinone, 2-t-butylanthraquinone and 1-chloroanthraquinone. Examples of the thioxanthones include 2,4-dimethylthioxanthone, 2,4-diethylthioxanthone, 2-chlorothioxanthone and 2,4-diisopropylthioxanthone. Examples of the ketals include acetophenonedimethyl ketal and benzyldimethyl ketal. Examples of the thiol compounds include 2-mercaptobenzoimidazole, 2-mercaptobenzooxazole and 2-mercaptobenzothiazole. Examples of the organic halogen compounds include 2,2,2-tribromoethanol and tribromomethylphenylsulfone. Examples of the benzophenones include benzophenone and 4,4'-bisdiethylaminobenzophenone.

The photoradical polymerization initiator is preferably an α-aminoalkylphenone type photoradical polymerization initiator, and more preferably an α-aminoalkylphenone type photoradical polymerization initiator having a dimethylamino group. By using this specific photoradical polymerization initiator, it becomes possible to efficiently make the curable composition for inkjet photo-cure with a small amount of light exposure. Therefore, it is possible to effectively prevent the applied curable composition for inkjet from wet spreading by light irradiation, and to form a fine resist pattern with high accuracy. Further, when the photoradical polymerization initiator is an α-aminoalkylphenone type photopolymerization initiator having a dimethylamino group, it is possible to increase the heat-curing speed, and to improve the heat curability of the light irradiated product of the composition.

The inventors of the present invention found that by using an α-aminoalkylphenone type photoradical polymerization initiator having a dimethylamino group, not only the light curability can be improved, but also the heat curability can be improved. The α-aminoalkylphenone type photoradical polymerization initiator having a dimethylamino group is an ingredient that largely contributes to improvement in heat curability. Further, by using an α-aminoalkylphenone type photoradical polymerization initiator having a dimethylamino group, it is possible to improve the heat resistance and insulation reliability of the cured product. Excellent insulation reliability will keep the insulation resistance sufficiently high even when an electronic component such as a printed wiring board having a resist pattern formed of the curable composition for inkjet according to the present invention is used under a highly humid condition for a long term.

Concrete examples of the α-aminoalkylphenone type photoradical polymerization initiator include IRGACURE 907, IRGACURE 369, IRGACURE 379 and IRGACURE 379EG available from BASF. Other α-aminoalkylphenone type photopolymerization initiators than these may be used. Among these, 2-benzyl-2-dimethylamino-1-(4-morpholinophenyl)-butanone-1 (IRGACURE 369) or 2-(dimethylamino)-2-[(4-methylphenyl)methyl]-1-[4-(4-morpholinyl) phenyl]-1-butanone (IRGACURE 379 or IRGACURE 379EG) is preferred from the view point of further improving the light curability of the curable composition for inkjet and insulation reliability by the cured product. These are α-aminoalkylphenone type photoradical polymerization initiators having a dimethylamino group.

Together with the photoradical polymerization initiator, a photopolymerization initiation auxiliary agent may be used. Examples of the photopolymerization initiation auxiliary agent include N,N-dimethylaminobenzoic acid ethyl ester, N,N-dimethylaminobenzoic acid isoamyl ester, pentyl-4-dimethylaminobenzoate, triethylamine and triethanolamine. Other photopolymerization initiation auxiliary agents than these may be used. The photopolymerization initiation auxiliary agent may be used singly or in combination of two or more kinds.

Also, titanocene compounds such as CGI-784 (available from Ciba Specialty Chemicals) having absorption in the visible light region may be used for promoting photo reaction.

The photocationic polymerization initiator is not particularly limited, and examples include sulfonium salts, iodonium salts, metallocene compounds and benzoin tosylate. The photocationic polymerization initiator may be used singly or in combination of two or more kinds.

The content of the photopolymerization initiator (B) with respect to 100 parts by weight of the polyfunctional compound (A) is preferably 0.1 parts by weight or more, more preferably 1 part by weight or more, further preferably 3 parts by weight or more, preferably 30 parts by weight or less, more preferably 15 parts by weight or less and further preferably 10 parts by weight or less. When the content of the photopolymerization initiator (B) is more than or equal to the aforementioned lower limit and less than or equal to the aforementioned upper limit, the curable composition will cure further effectively by light irradiation.

[Compound Having Cyclic Ether Group (C)]

The curable composition for inkjet according to the present invention contains a compound having a cyclic ether group (C) so that it is able to cure by heat addition. By using the compound (C), it is possible to make the curable composition or the primary cured product of the curable composition further cure by heat addition. Therefore, it is possible to form a resist pattern efficiently and accurately by using the compound (C), and further to improve the heat resistance and insulation reliability of the cured product. The compound having a cyclic ether group (C) may be used singly or in combination of two or more kinds.

The compound having a cyclic ether group (C) is not particularly limited insofar as it has a cyclic ether group. Examples of the cyclic ether group in the compound (C) include an epoxy group and an oxetanyl group. Among these, the cyclic ether group is preferably an epoxy group from the view point of increasing the curability, and obtaining a more excellent cured product by heat resistance and insulation reliability. The compound having a cyclic ether group (C) preferably has two or more cyclic ether groups.

Concrete examples of the compound having an epoxy group include bisphenol S type epoxy compounds, diglycidyl phthalate compounds, heterocyclic epoxy compounds such as triglycidyl isocyanurate, bixylenol type epoxy compounds, biphenol type epoxy compounds, tetraglycidylxylenoylethane compounds, bisphenol A type epoxy compounds, hydrogenated bisphenol A type epoxy compounds, bisphenol F type epoxy compounds, brominated bisphenol A type epoxy compounds, phenol novolak type epoxy compounds, cresol novolak type epoxy compounds, alicyclic epoxy compounds, novolak type epoxy compounds of bisphenol A, chelate type epoxy compounds, glyoxal type epoxy compounds, amino group-containing epoxy compounds, rubber-modified epoxy compounds, dicyclopentadienephenolic type epoxy compounds, silicone-modified epoxy compounds and ε-caprolactone-modified epoxy compounds.

The compound having a cyclic ether group (C) preferably has an aromatic backbone. By the use of the compound having an aromatic backbone and a cyclic ether group, heat stability of the curable composition during storage and discharge is further improved, and the curable composition is less likely to gelate during storage. Further, since the compound having an aromatic backbone and a cyclic ether group has better compatibility with the polyfunctional compound (A), the monofunctional compound (E) and the curing agent (C) than the compound not having an aromatic backbone but having a cyclic ether group, the insulation reliability is further improved.

The compound having an oxetanyl group is exemplified, for example, in Japanese Patent No. 3074086.

The compound having a cyclic ether group (C) is preferably liquid at 25° C. The viscosity at 25° C. of the compound having a cyclic ether group (C) preferably exceeds 300 mPa·s. The viscosity at 25° C. of the compound having a cyclic ether group (C) is preferably 80 Pa·s or less. When the viscosity of the compound having a cyclic ether group (C) is more than or equal to the aforementioned lower limit, resolution at the time of forming a cured product layer is further improved. When the viscosity of the compound having a cyclic ether group (C) is less than or equal to the aforementioned upper limit, dischargeability of the curable composition is further improved, and compatibility of the compound having a cyclic ether group (C) with other ingredients is further increased, so that insulation reliability is further improved.

The blending amount of the compound having a cyclic ether group (C) is appropriately adjusted so that appropriate curing is achieved by heat addition, and is not particularly limited. The content of the compound having a cyclic ether group (C) in 100% by weight of the curable composition for inkjet is 3% by weight or more, preferably 99% by weight or less, more preferably 95% by weight or less, and further preferably 80% by weight or less. In 100% by weight of the curable composition for inkjet, the content of the compound having a cyclic ether group (C) is more preferably 5% by weight or more, and further preferably 10% by weight or more. When the polyfunctional compound (A) and the photopolymerization initiator (B) are used, in 100% by weight of the curable composition for inkjet, the content of the compound having a cyclic ether group (C) is particularly preferably 50% by weight or less, and most preferably 40% by weight or less. When the content of the compound (C) is more than or equal to the aforementioned lower limit, the curable composition can be made to cure more effectively by heat addition. When the content of the compound (C) is less than or equal to the aforementioned upper limit, heat resistance of the cured product is further improved.

[Curing Agent (D)]

A curing agent (D) is a reaction viscous product obtained by reacting dicyandiamide with a functional group-containing compound having a functional group capable of reacting with the dicyandiamide. Since such a curing agent (D) is used, the curable composition is able to cure by heat addition. Further, by making the curable composition including both the compound having a cyclic ether group (C) and the curing agent (D) heat-cure, it is possible to improve the insulation reliability by the cured product.

The reaction viscous product may not be viscous in the curable composition for inkjet as far as the reaction viscous product by itself has a viscous property before being used in the curable composition for inkjet. Also, the reaction viscous product may be viscous when the reaction viscous product is removed from the curable composition for inkjet.

Since dicyandiamide (dicyandiamide particle) which is solid at normal temperature (23° C.) exists in a solid in a liquid ingredient, it can precipitate during storage or cause clogging of a nozzle of an inkjet head. For solving such a problem, dicyandiamide is reacted in advance with a functional group-containing compound having a functional group capable of reacting with the dicyandiamide to produce a reaction viscous product, which is added to the composition. That is, in the curable composition for inkjet according to the present invention, the curing agent (D) which is a reaction viscous product obtained by reacting dicyandiamide with a functional group-containing compound having a functional group capable of reacting with the dicyandiamide is used. Use of the curing agent (D) improves the pot life of the composition and insulation reliability by the cured product.

Preferably, in the reaction viscous product (E1) before blended into the curable composition for inkjet, an organic solvent is not blended or is blended in an amount of 100 parts by weight or less with respect to 100 parts by weight of the reaction viscous product (E1). When an organic solvent is blended in the reaction viscous product (E1), the amount of the organic solvent blended with respect to 100 parts by weight of the reaction viscous product (E1) is preferably 50 parts by weight or less, more preferably 20 parts by weight or less, further preferably 10 parts by weight or less, and particularly preferably 1 part by weight or less.

The reaction viscous product is preferably a reaction product obtained by reacting the functional group-containing compound with part of active hydrogen in dicyandiamide. The functional group capable of reacting with dicyandiamide in the functional group-containing compound generally reacts with part of active hydrogen in dicyandiamide.

The dicyandiamide reacted with the functional group-containing compound is preferably powdered state. By reacting powdery dicyandiamide with the functional group-containing compound, the product is no longer powdered state, and the viscous reaction viscous product is obtained.

From the view point of easily synthesizing the reaction viscous product and obtaining a curable composition having a longer pot life, the functional group-containing compound that reacts with the dicyandiamide preferably has at least one functional group selected from the group consisting of a hydroxyl group, a cyclic ether group, a carboxyl group and an isocyanate group.

From the view point of easily synthesizing the reaction viscous product and obtaining a curable composition having a longer pot life, the functional group-containing compound that reacts with the dicyandiamide is preferably a compound having a cyclic ether group. The compound having a cyclic ether group that reacts with dicyandiamide is preferably a compound having one cyclic ether group.

From the view point of easily synthesizing the reaction viscous product and obtaining a curable composition having a longer pot life, the functional group-containing compound that reacts with the dicyandiamide is preferably a compound having an epoxy group. The compound having an epoxy group that reacts with dicyandiamide is preferably a compound having one epoxy group.

From the view point of easily synthesizing the reaction viscous product and obtaining a curable composition for inkjet having a longer pot life, and further from the view point of further improving the heat resistance of the cured product of the curable composition, the functional group-containing compound that reacts with the dicyandiamide preferably has an aromatic backbone, and is preferably a compound having an aromatic backbone and a cyclic ether group, and is particularly preferably a compound having an aromatic backbone and an epoxy group.

Concrete examples of the functional group-containing compound include glycidyl ethers such as phenylglycidyl ether, butylglycidyl ether, ortho-cresylglycidyl ether, meta-cresylglycidyl ether, para-cresylglycidyl ether, allyl glycidyl ether, and para-t-butylphenylglycidyl ether, glycidyl (meth)acrylate, and 3,4-epoxycyclohexylmethyl (meth)acrylate.

From the view point of further improving the heat resistance of the cured product, the functional group-containing compound is preferably phenylglycidyl ether, ortho-cresylglycidyl ether, meta-cresylglycidyl ether, para-cresylglycidyl ether or para-t-butylphenylglycidyl ether having an aromatic ring, respectively.

In the reaction between the dicyandiamide and the functional group-containing compound, it is desired that preferably 0.2 mol or more, more preferably 1 mol or more, preferably 4 mol or less, and more preferably 3 mol or less of the functional group-containing compound is reacted with 1 mol of the dicyandiamide. In other words, the reaction viscous product is desirably a reaction viscous product obtained by reacting preferably 0.2 mol or more, more preferably 1 mol or more, preferably 4 mol or less, and more preferably 3 mol or less of the functional group-containing compound is reacted with 1 mol of the dicyandiamide. From the view point of obtaining a curable composition having more excellent pot life, it is particularly desired that the reaction viscous product is a reaction viscous product obtained by reacting 1 mol or more and 3 mol or less of the functional group-containing compound with 1 mol of the dicyandiamide. When the use amount of the functional group-containing compound is less than the aforementioned lower limit, unreacted dicyandiamide may precipitate. When the use amount of the functional group-containing compound exceeds the aforementioned upper limit, any active hydrogen in the reaction viscous product is inactivated, and the compound (C) may be no longer made to cure. In the present reaction, it is preferred to allow reaction in the presence of a solvent or a reaction accelerator as is necessary at 60° C. to 140° C.

In the reaction between the dicyandiamide and the functional group-containing compound, a solvent for dissolving dicyandiamide may be used. The solvent has only to dissolve dicyandiamide. Examples of usable solvents include acetone, methylethyl ketone, dimethylformamide and methyl cellosolve.

For promoting the reaction between the dicyandiamide and the functional group-containing compound, a reaction accelerator may be used. As the reaction accelerator, reaction accelerators that are known and commonly used in the art such as phenols, amines, imidazoles and triphenylphosphine may be used.

From the view point of controlling deterioration in pot life, and preventing curing unevenness, in the curable composition for inkjet according to the present invention, the reaction viscous product is preferably compatible with the compound having a cyclic ether group (C), preferably compatible with the compound (A) having two or more (meth)acryloyl groups, and preferably compatible with the monofunctional compound (E), and is preferably dissolved in the curable composition.

The reaction viscous product is preferably compatible with the compound having a cyclic ether group (C), preferably compatible with the compound (A) having two or more (meth)acryloyl groups, and is preferably compatible with the monofunctional compound (E).

The reaction viscous product is a non-powdery reaction viscous product, obtained for example, by reaction between powdery dicyandiamide and the functional group-containing compound. From the view point of further improving the inkjet dischargeability, the reaction viscous product is not preferably solid, not preferably crystal and not preferably crystalline solid. The reaction viscous product is preferably liquid or semi-solid.

The reaction viscous product is preferably transparent or translucent. Whether or not the reaction viscous product is transparent or translucent can be determined by whether or not an object is visible when the object is seen through the reaction viscous product having a thickness of 5 mm.

The blending ratio between the compound having a cyclic ether group (C) and the reaction viscous product is not particularly limited. The blending amount of the reaction viscous product is appropriately adjusted so that appropriate curing is achieved by heat addition, and is not particularly limited. The content of the reaction viscous product with respect to 100 parts by weight of the compound having a cyclic ether group (C) is preferably 5 parts by weight or more, more preferably 10 parts by weight or more, preferably 60 parts by weight or less, and more preferably 50 parts by weight or less.

(Mono-functional Compound (E))

The curable composition for inkjet according to the present invention preferably contains a monofunctional compound having a polycyclic backbone and having one (meth)acryloyl group (E). Further, the curable composition for inkjet according to the present invention more preferably contains the multifunctional compound having a polycyclic backbone and having two or more (meth)acryloyl groups (A1), and the monofunctional compound having a polycyclic backbone and having one (meth)acryloyl group (E). In these cases, moist heat resistance of the cured product of the curable composition for inkjet is significantly improved. Therefore, it is possible to use an electronic component such as printed wiring board applied the curable composition for inkjet according to the present invention for a longer term, and to further improve the reliability of the electronic component. Further, by using the monofunctional compound (E), not only moist heat resistance of the cured product is increased, but also dischargeability of the curable composition is increased. When the monofunctional compound having a polycyclic backbone and having one (meth)acryloyl group (E) is used, moist heat resistance of the cured product is increased in comparison with the case where a monofunctional compound not having a polycyclic backbone but having one (meth)acryloyl group is used.

The mono-functional compound (E) is not particularly limited insofar as it has a polycyclic backbone and has one (meth)acryloyl group. As the monofunctional compound (E), a conventionally known monofunctional compound having a polycyclic backbone and having one (meth)acryloyl group may be used. The mono-functional compound (E) may be used singly or in combination of two or more kinds.

Concrete examples of the monofunctional compound (E) include isobornyl (meth)acrylate, dihydroxycyclopentadienyl (meth)acrylate, dicyclopentenyl (meth)acrylate, dicyclopentenyloxyethyl (meth)acrylate, dicyclopentanyl (meth)acrylate and naphthyl (meth)acrylate. Among these, from the view point of further enhancing the moist heat resistance of the cured product, the monofunctional compound (E) is preferably at least one selected from the group consisting of isobornyl (meth)acrylate, dihydroxycyclopentadienyl (meth)acrylate, dicyclopentenyl (meth)acrylate, dicyclopentenyloxyethyl (meth)acrylate and dicyclopentanyl (meth) acrylate.

The content of the monofunctional compound (E) in 100% by weight of the curable composition for inkjet is preferably 5% by weight or more, more preferably 15% by weight or more, preferably 50% by weight or less, and more preferably 45% by weight or less.

In a total of 100% by weight of the polyfunctional compound (A1), the monofunctional compound (E) and the photopolymerization initiator (B), the content of the monofunctional compound (E) is preferably 5% by weight or more and preferably 50% by weight or less. In a total of 100% by weight of the polyfunctional compound (A1), the monofunctional compound (E) and the photopolymerization initiator (B), the content of the monofunctional compound (E) is more preferably 15% by weight or more, and more preferably 45% by weight or less. When the content of the monofunctional compound (E) is more than or equal to the aforementioned lower limit, the moist heat resistance of the cured product is further improved. When the content of the monofunctional compound (E) is less than or equal to the aforementioned upper limit, it is possible to make the curable composition cure more effectively by light irradiation.

In 100% by weight of the curable composition for inkjet, the upper limit of a total content of the polyfunctional compound (A1) and the monofunctional compound (E) is appropriately adjusted depending on the content of the photopolymerization initiator (B).

[Other Ingredient]

The curable composition for inkjet according to the present invention may contain a heat-curing agent other than the reaction viscous product. Further, the curable composition for inkjet according to the present invention may contain a curing accelerator.

Concrete examples of the heat curing agent include organic acids, amine compounds, amide compounds, hydrazide compounds, imidazole compounds, imidazoline compounds, phenol compounds, urea compounds, polysulfide compounds and acid anhydrides. As the heat curing agent, modified polyamine compounds such as amine-epoxy adduct may be used.

Examples of the curing accelerator include tertiary amines, imidazole, quaternary ammonium salts, quaternary phosphonium salts, organic metal salts, phosphorus compounds and urea compounds.

The curable composition for inkjet according to the present invention may contain various additives as far as the object of the present invention is not interfered. The additives are not particularly limited, and examples include a coloring agent, a polymerization inhibitor, a defoaming agent, a leveling agent and an adhesion imparting agent. Also, the curable composition for inkjet according to the present invention may contain just a small amount of organic solvent.

Examples of the coloring agent include phthalocyanine blue, phthalocyanine green, iodine green, disazo yellow, crystal violet, titanium oxide, carbon black and naphthalene black. Examples of the polymerization inhibitor include hydroquinone, hydroquinone monomethyl ether, tert-butyl catechol, pyrogallol and phenothiazine. Examples of the defoaming agent include silicone defoaming agents, fluorine defoaming agents and polymer defoaming agents. Examples of the leveling agent include silicone leveling agents, fluorine leveling agents and polymer leveling agents. Examples of the adhesion imparting agent include imidazole adhesion imparting agents, thiazole adhesion imparting agents, triazole adhesion imparting agents and silane coupling agents.

In the curable composition for inkjet according to the present invention, the viscosity at 25° C. measured in conformance with JIS K2283 is preferably 160 mPa·s or more and 1200 mPa·s or less. When the viscosity of the curable composition for inkjet is more than or equal to the aforementioned lower limit and less than or equal to the aforementioned upper limit, it is possible to discharge the curable composition for inkjet from an inkjet head easily and accurately. Further, even when the curable composition for inkjet is warmed to 50° C. or higher, the composition can be discharged from an inkjet head easily and accurately.

The viscosity is preferably 1000 mPa·s or less, and more preferably 500 mPa·s or less. When the viscosity satisfies the aforementioned preferred upper limit, the dischargeability is further improved when the curable composition is continuously discharged from a head. Also, from the view point of further preventing wet spreading of the curable composition and further improving the resolution in forming a cured product layer, the viscosity preferably exceeds 500 mPa·s.

Preferably, the curable composition for inkjet according to the present invention does not contain an organic solvent, or contains an organic solvent in an amount of 50% by weight or less in 100% by weight of the curable composition. In 100% by weight of the curable composition, the content of the organic solvent is more preferably 20% by weight or less, further preferably 10% by weight or less, and particularly preferably 1% by weight or less. The lower the content of the organic solvent, the more the resolution at the time of forming a cured product layer is improved.

Preferably, the curable composition for inkjet according to the present invention does not contain an organic solvent, or contains an organic solvent in an amount of 50 parts by weight or less in 100 parts by weight of the reaction viscous product (E1). The content of the organic solvent with respect to 100 parts by weight of the reaction viscous product (E1) is more preferably 20 parts by weight or less, further preferably 10 parts by weight or less, and particularly preferably 1 part by weight or less. The lower the content of the organic solvent, the more the resolution at the time of forming a cured product layer is improved.

(Method for Producing Electronic Component)

Next, a method for producing an electronic component according to the present invention will be described.

A method for producing an electronic component according to the present invention is featured in that the curable composition for inkjet as described above is used. In other words, in the method for producing an electronic component according to the present invention, first, the curable composition for inkjet is applied by an inkjet method to draw a pattern. At this time, it is particularly preferred to directly draw with the curable composition for inkjet. The expression "directly draw" means drawing without using a mask. As the electronic component, a printed wiring board, a touch panel component and the like are recited. The electronic component is preferably a wiring board, and is more preferably a printed wiring board.

For application of the curable composition for inkjet, an inkjet printer is used. The inkjet printer has an inkjet head. The inkjet head has a nozzle. The inkjet device preferably has a warming part for warming so that the temperature in the inkjet device or in the inkjet head is 50° C. or higher. The curable composition for inkjet is preferably applied on an application object member. As the application object member, a substrate and the like are recited. As the substrate, a substrate having a wiring or the like formed on its top face and the like are recited. The curable composition for inkjet is preferably applied on a printed substrate.

Also, by the method for producing an electronic component according to the present invention, a glass substrate for a display device such as liquid crystal display device may be fabricated by replacing the substrate with a member based on glass. Concretely, on the glass, a conductive pattern of ITO or the like is provided by a method like vapor deposition, and on the conductive pattern, a cured product layer may be formed by an inkjet method by the method for producing an electronic component according to the present invention. By providing a pattern on the cured product layer with a conductive ink or the like, the cured product layer becomes an insulation film, and electric connection is obtained between predetermined patterns in the conductive pattern on the glass.

Next, the curable composition for inkjet drawn into a pattern is made to cure by heat addition, to form a cured product layer. When a curable composition for inkjet containing the polyfunctional compound (A) and the photopolymerization initiator (B) is used as the curable composition for inkjet, the curable composition for inkjet drawn into a pattern is made to cure by light irradiation and heat addition, to form a cured product layer. In this manner, it is possible to obtain an electronic component having a cured product layer. The cured product layer may be an insulation film or may be a resist pattern. The insulation film may be a patterned insulation film. The cured product layer is preferably a resist pattern. The resist pattern is preferably a solder resist pattern.

The method for producing an electronic component according to the present invention is preferably a method for producing a printed wiring board having a resist pattern. Preferably, the curable composition for inkjet is applied by an inkjet method and drawn into a pattern, and the curable composition for inkjet drawn into a pattern is made to cure by light irradiation and heat addition to form a resist pattern.

The curable composition for inkjet drawn into a pattern may be made to primarily cure by light irradiation, to obtain a primary cured product. As a result, it is possible to prevent the drawn curable composition for inkjet from wet spreading, and to form a resist pattern with high accuracy. When a primary cured product is obtained by light irradiation, the primary cured product may be made to cure by heat addition to obtain a cured product, and a cured product layer such as a resist pattern may be formed. The curable composition for inkjet according to the present invention is able to cure by light irradiation and heat addition. When both light curing and heat curing are used, it is possible to form a cured product layer such as a resist pattern having more excellent heat resistance. Heating temperature at the time of curing by heat addition is preferably 100° C. or more, more preferably 120° C. or more, preferably 250° C. or less, and more preferably 200° C. or less.

The light irradiation may be conducted after drawing, or may be conducted concurrently with drawing. For example, light irradiation may be conducted concurrently with discharge or directly after discharge of the curable composition. For conducting light irradiation concurrently with drawing as described above, a light source may be arranged so that a light irradiation part is situated at the drawing position by the inkjet head.

The light source for light irradiation is appropriately selected depending on the light for irradiation. Examples of the light source include a UV-LED, a low-pressure mercury lamp, a medium-pressure mercury lamp, a high-pressure mercury lamp, a ultrahigh-pressure mercury lamp, a xenon lamp and a metal halide lamp. The light for irradiation is generally ultraviolet ray, and may be an electron ray, α ray, β ray, γ ray, X ray, neutron ray and the like.

The temperature at the time of application of the curable composition for inkjet is not particularly limited as far as it renders the curable composition for inkjet viscous enough to be discharged from an inkjet head. The temperature at the time of application of the curable composition for inkjet is preferably 50° C. or more, more preferably 60° C. or more, and preferably 100° C. or less. The viscosity of the curable composition for inkjet at the time of application is not particularly limited as far as the curable composition for inkjet can be discharged from an inkjet head.

Also there is a method of cooling the substrate at the time of printing. By cooling the substrate, the viscosity of the curable composition increases at the time of reaching the substrate and the resolution improves. In this case, it is preferred to limit the cooling to such a degree that condensation will not occur, or to dehumidify the atmospheric air so that condensation will not occur. Also, since the substrate contracts when it is cooled, the dimension accuracy may be corrected.

Since the curable composition for inkjet according to the present invention contains a specific reaction viscous product as the curing agent (D), even when the curable composition for inkjet is heated in an inkjet head, for example, the curable composition for inkjet has a sufficiently long pot life and can be discharged stably. Further, since the curable composition for inkjet can be heated until it has a viscosity suited for application by an inkjet method, it is possible to preferably produce an electronic component such as printed wiring board by using the curable composition for inkjet according to the present invention.

In the following, the present invention will be concretely described by way of examples and comparative examples. The present invention is not limited only to the following examples.

SYNTHESIS EXAMPLE 1

In a three-necked flask equipped with a stirrer, a thermometer and a dropping funnel, 50 g of methyl cellosolve, 15 g of dicyandiamide and 1 g of 2,4-diamino-6-[2'-undecylimidazolyl-(1')]-ethyl-s-triazine were added, and heated to 100° C. to dissolve dicyandiamide. After dissolution, 130 g of butyl glycidyl ether was dropped over 20 minutes from the dropping funnel, and allowed to react for one hour. Then the temperature was decreased to 60° C., and the solvent was removed under reduced pressure, to obtain a yellow and translucent reaction viscous product. The obtained reaction viscous product did not contain a solvent.

SYNTHESIS EXAMPLE 2

In a three-necked flask equipped with a stirrer, a thermometer and a dropping funnel, 50 g of methyl cellosolve, 15 g of dicyandiamide and 1 g of 2,4-diamino-6-[2'-undecylimidazolyl-(1')]-ethyl-s-triazine were added, and heated to 100° C. to dissolve dicyandiamide. After dissolution, 40 g of ortho-cresyl glycidyl ether was dropped over 20 minutes from the dropping funnel, and allowed to react for one hour. Then the temperature was decreased to 60° C., and the solvent was removed under reduced pressure, to obtain a yellow and translucent reaction viscous product. The obtained reaction viscous product did not contain a solvent.

SYNTHESIS EXAMPLE 3

A yellow and translucent reaction viscous product was obtained in a similar manner to Synthesis Example 2 except that the dropping amount of ortho-cresyl glycidyl ether was changed from 40 g to 95 g. The obtained reaction viscous product did not contain a solvent.

Also, the following photopolymerization initiators were prepared.

Irgacure 907 (available from BASF Japan Ltd.): α-aminoalkylphenone type photoradical polymerization initiator not having a dimethylamino group Irgacure 369 (available from BASF Japan Ltd.): α-aminoalkylphenone type photoradical polymerization initiator having a dimethylamino group Irgacure 379EG (available from BASF Japan Ltd.): α-aminoalkylphenone type photoradical polymerization initiator having a dimethylamino group TPO (available from BASF Japan Ltd.): acylphosphine oxide type photoradical polymerization initiator Irgacure 184 (available from BASF Japan Ltd.): α-hydroxyalkylphenone type photoradical polymerization initiator

EXAMPLE 1

Trimethylol propane triacrylate ("TMPTA" available from DAICEL-CYTEC Company, Ltd.) (80 parts by weight) corresponding to the polyfunctional compound (A), 5 parts by weight of α-aminoacetophenone type photoradical polymerization initiator ("Irgacure 907" available from BASF Japan Ltd.) corresponding to the photopolymerization initiator (B), 20 parts by weight of bisphenol A type epoxy resin ("YD-127" available from NIPPON STEEL CHEMICAL Co., Ltd.) corresponding to the compound having a cyclic ether group (C), and 4 parts by weight of the reaction viscous product obtained in Synthesis Example 1 were mixed, to obtain a curable composition for inkjet.

EXAMPLE 2

50 parts by weight of bisphenol F type epoxy resin ("YD-170" available from NIPPON STEEL CHEMICAL Co., Ltd.) corresponding to the compound having a cyclic ether group (C), 50 parts by weight of neopentyl glycol diglycidyl ether ("EX-211" available from Nagase ChemteX Corporation) corresponding to the compound having a cyclic ether group (C), and 30 parts by weight of the reaction viscous product obtained in Synthesis Example 2 were mixed, to obtain a curable composition for inkjet.

EXAMPLES 3 TO 16 AND COMPARATIVE EXAMPLES 1 TO 5

Curable compositions for inkjet were obtained in a similar manner to Example 1 except that the kinds and blending amounts of ingredients were changed as shown in the following Tables 1 to 3.

In the curable compositions for inkjet obtained in Examples 1 to 16, the reaction viscous product was compatible with the polyfunctional compound, was compatible with the compound having a cyclic ether group, and was dissolved in the curable composition.

EVALUATION OF EXAMPLES 1 to 16 AND COMPARATIVE EXAMPLES 1 to 5

(1) Viscosity

In conformance with JIS K2283, the viscosity at 25° C. of the obtained curable composition for inkjet was measured by using a viscometer ("TVE22L" available from TOKI SANGYO CO., LTD). The viscosity of the curable composition for inkjet was judged according to the following judging criteria.

[Judging Criteria of Viscosity]

A: Viscosity is more than 1200 mPa·s

B: Viscosity is more than 1000 mPa·s and 1200 mPa·s or less

C: Viscosity is more than 500 mPa·s and 1000 mPa·s or less

D: Viscosity is 160 mPa·s or more and 500 mPa·s or less

E: Viscosity is less than 160 mPa·s (2) Inkjet Dischargeability

For the obtained curable composition for inkjet, a discharge test from an inkjet head of a piezo type inkjet printer equipped with a UV illuminator was conducted, and evaluation was made according to the following judging criteria. At the time of conducting the discharge test for a curable composition having a viscosity of 500 mPa·s or less, the head temperature was set at 80° C., and at the time of conducting the discharge test for a curable composition having a viscosity of more than 500 mPa·s, the head temperature was set at 95° C.

[Judging Criteria of Inkjet Dischargeability]

○○: The curable composition could be discharged from the head continuously for over 10 hours.

○: The curable composition could be discharged from the head continuously for over 10 hours, but slight discharging unevenness occurred during continuous discharging for 10 hours.

Δ: The curable composition could be continuously discharged from the head, but could not be continuously discharged for over 10 hours.

x: The curable composition could not be discharged from the head in early stage of the discharging.

(3) Wet Spreading

A FR-4 substrate with a copper foil having a copper foil pasted on the top face was prepared. On this substrate, a curable composition for inkjet discharged from an inkjet head of a piezo type inkjet printer equipped with a UV illuminator was applied and drawn into a pattern with lines of 80 μm wide at line intervals of 80 μm so that it covered the entire surface of the copper foil. At the time of conducting the discharge test for a curable composition for inkjet having a viscosity of 500 mPa·s or less, the head temperature was set at 80° C., and at the time of conducting the discharge test for a curable composition for inkjet having a viscosity of more than 500 mPa·s, the head temperature was set at 95° C.

The curable composition for inkjet (thickness 20 μm) applied on the substrate was irradiated with an ultraviolet ray having a wavelength of 365 nm so that the irradiation energy was 1000 mJ/cm$^2$.

After 5 minutes from irradiation with the ultraviolet ray, wet spreading of the pattern was visually observed, and wet spreading was judged according to the following judging criteria.

[Judging Criteria of Wet Spreading]

○○: The wet spreading condition is not more than 40 μm plus the target line width.

○: The wet spreading condition is more than 40 μm and 75 μm or less plus the target line width.

x: The composition layer wet spreads from the drawn part, and gaps between lines are lost, or the wet spreading condition is more than 75 μm plus the target line width.

(4) Storage Stability (Length of Pot Life)

Using a membrane filter of 5 μm, the obtained curable composition for inkjet was filtered, and the filtered curable composition for inkjet was heated at 80° C. for 12 hours.

A FR-4 substrate with a copper foil having a copper foil pasted on the top face was prepared. It was attempted to apply, on the copper film of the substrate, a curable composition for inkjet discharged from an inkjet head of a piezo type inkjet printer equipped with a UV illuminator and draw a pattern with lines of 80 μm wide at line intervals of 80 μm. From the dischargeability from the inkjet head at this time, storage stability was judged according to the following judging criteria. At the time of conducting the discharge test for a curable composition having a viscosity of 500 mPa·s or less, the head temperature was set at 80° C., and at the time of conducting the discharge test for a curable composition having a viscosity of more than 500 mPa·s, the head temperature was set at 95° C.

[Judging Criteria of Storage Stability]

○: The composition could be discharged from the inkjet head.

x: The composition could not be discharged from the inkjet heat because the composition cured or the viscosity of the composition increased before discharging.

(5) Heat Resistance

A FR-4 substrate with a copper foil having a copper foil pasted on the top face was prepared. On the copper foil of the substrate, a curable composition for inkjet discharged from an inkjet head of a piezo type inkjet printer equipped with a UV illuminator was applied and drawn into a pattern with lines of 80 μm wide at line intervals of 80 μm. At the time of conducting the discharge test for a curable composition having a viscosity of 500 mPa·s or less, the head temperature was set at 80° C., and at the time of conducting the discharge test for a curable composition having a viscosity of more than 500 mPa·s, the head temperature was set at 95° C.

The curable composition for inkjet (thickness 20 μm) drawn into a pattern was irradiated with an ultraviolet ray having a wavelength of 365 nm so that the irradiation energy was 1000 mJ/cm$^2$, to obtain a primary cured product. Then the primary cured product was made to really cure by heating at 150° C. for 60 minutes, and a resist pattern which is a cured product was obtained.

The obtained laminate of the substrate and the resist pattern was heated in an oven at 270° C. for 5 minutes, and then the appearance of the resist pattern after heating was visually examined. Further, cellophane tape was put on the resist pattern after heating, and the cellophane tape was peeled off in the direction of 90 degrees. By an appearance examination and a peeling test, heat resistance was judged according to the following judging criteria.

[Judging Criteria of Heat Resistance]

○: No change was observed in the resist pattern before and after heating in the appearance examination, and the resist pattern did not peel off from the substrate in the peeling test.

x: At least one of crack, peeling and blister was observed in the resist pattern in the appearance examination, or the resist pattern peeled off from the substrate in the peeling test.

(6) Insulation Reliability (Migration Resistance)

A comb-shaped test pattern B of IPC-B-25 was prepared. This comb-shaped test pattern B was warmed to 80° C., and a curable composition for inkjet discharged from an inkjet head of a piezo type inkjet printer equipped with a UV illuminator was applied so that the entire surface of the comb-shaped test pattern B was covered. At the time of conducting the discharge test for a curable composition having a viscosity of 500 mPa·s or less, the head temperature was set at 80° C., and at the time of conducting the discharge test for a curable composition having a viscosity of more than 500 mPa·s, the head temperature was set at 95° C.

The applied curable composition for inkjet (thickness 20 μm) was irradiated with an ultraviolet ray having a wavelength of 365 nm so that the irradiation energy was 1000 mJ/cm$^2$, to obtain a primary cured product. Then the primary cured product was made to really cure by heating at 150° C. for 60 minutes to form a resist pattern which is a cured product, and thus a test piece was obtained.

The obtained test piece was subjected to a 500-hour humidification test at 85° C., at a relative humidity of 85% under application of DC 50 V. Insulation resistance after the humidification test was measured.

The results are shown in the following Tables 1 to 3. In the following Tables 1 to 3, "-" indicates that evaluation was not made. A curable composition for inkjet not heated at 80° C. for 12 hours was used except for the evaluation of storage stability. In the following Table 3, *1 indicates that the insulation resistance is $1\times10^9$ or more and less than $3\times10^{10}$.

TABLE 1

| Blending ingredient (part by weight) | | Product number | | Manufacturer | EX. 1 | EX. 2 | EX. 3 | EX. 4 | EX. 5 | EX. 6 | EX. 7 | EX. 8 |
|---|---|---|---|---|---|---|---|---|---|---|---|---|
| (C) ingredient | | YD-127 | Bisphenol A type epoxy resin | NIPPON STEEL CHEMICAL Co., Ltd. | 20 | | 20 | 15 | 20 | 15 | 35 | 25 |
| | | YDF-170 | Bisphenol F type epoxy resin | NIPPON STEEL CHEMICAL Co., Ltd. | | 50 | | | | | | |
| | | EX-211 | Neopentyl glycol diglycidyl ether | Nagase ChemteX Corporation | | 50 | | | | | | |
| (A) ingredient | | TMPTA | Trimethylol propane triacrylate | DAICEL-CYTEC Company, Ltd. | 80 | | 80 | 85 | 80 | 85 | 65 | 75 |
| | | IRR214-K | Tricyclodecane dimethanol diacrylate | DAICEL-CYTEC Company, Ltd. | 5 | | 5 | 5 | 5 | 5 | | 5 |
| (B) ingredient | | Irgacure 907 | α-aminoacetophenone type photoradical polymerization initiator | BASF Japan Ltd. | | | | | | | | |
| | | Irgacure 369 | α-aminoacetophenone type photoradical polymerization initiator | BASF Japan Ltd. | | | | | | | 5 | |
| | | Irgacure 379EG | α-aminoacetophenone type photoradical polymerization initiator | BASF Japan Ltd. | | | | | | | | |
| | | TPO | Acylphosphine oxide type photoradical polymerization initiator | BASF Japan Ltd. | | | | | | | | |
| | | Irgacure 184 | α-hydroxyalkylphenone type photoradical polymerization initiator | BASF Japan Ltd. | 6 | 6 | 6 | 6 | 6 | 6 | 6 | 6 |
| (D) ingredient: Reaction viscous product | | Reaction viscous product obtained in Synthesis Example 1 | | | 4 | | | | | | | |
| | | Reaction viscous product obtained in Synthesis Example 2 | | | | 30 | | | | | | |
| | | Reaction viscous product obtained in Synthesis Example 3 | | | | | | | | | | |
| Curing agent which is not reaction viscous product | | DICY50 | Dicyandiamide (median radius: 45 μm) | Mitsubishi Chemical Corporation | | | | | | | | |
| | | 2E4MZ | 2-ethyl-4-methylimidazole | Shikoku Chemicals Corporation | | | | | | | | |
| | | C11Z-A | 2,4-diamino-6-[2′-undecylimidazoryl-(1′)]-ethyl-s-triazine | Shikoku Chemicals Corporation | | | | | | | | |
| Evaluation | (1) Viscosity | | | | D | D | D | D | D | D | B | C |
| | (2) Inkjet dischargeability | | | | ○ | ○ | ○ | ○ | ○ | ○ | △ | ○ |
| | (3) Wet spreading | | | | ○ | — | ○ | ○ | ○ | ○ | ○ | ○ |
| | (4) Storage stability | | | | ○ | △ | ○ | ○ | ○ | ○ | ○ | ○ |
| | (5) Heat resistance | | | | ○ | ○ | ○ | ○ | ○ | ○ | ○ | ○ |
| | (6) Insulation reliability (Migration resistance/Insulation resistance) (×10$^{10}$ Ω) | | | | 24 | 20 | 12 | 21 | 10 | 18 | 34 | 34 |

TABLE 2

| Blending ingredient (part by weight) | | Product number | | Manufacturer | Comp. EX. 1 | Comp. EX. 2 | Comp. EX. 3 | Comp. EX. 4 | Comp. EX. 5 |
|---|---|---|---|---|---|---|---|---|---|
| (C) ingredient | | YD-127 | Bisphenol A type epoxy resin | NIPPON STEEL CHEMICAL Co., Ltd. | 20 | 20 | 20 | 20 | 20 |
| | | YDF-170 | Bisphenol F type epoxy resin | NIPPON STEEL CHEMICAL Co., Ltd. | | | | | |
| | | EX-211 | Neopentyl glycol diglycidyl ether | Nagase ChemteX Corporation | | | | | |
| (A) ingredient | | TMPTA | Trimethylol propane triacrylate | DAICEL-CYTEC Company, Ltd. | 80 | 80 | 80 | 80 | 80 |
| | | IRR214-K | Tricyclodecane dimethanol diacrylate | DAICEL-CYTEC Company, Ltd. | | | | | |
| | | HDDA | Hexanediol diacrylate | | | | | | |
| (B) ingredient | | Irgacure 907 | α-aminoacetophenone type photoradical polymerization initiator | BASF Japan Ltd. | 5 | 5 | 5 | 5 | 5 |
| | | Irgacure 369 | α-aminoacetophenone type photoradical polymerization initiator | BASF Japan Ltd. | | | | | |
| | | Irgacure 379EG | α-aminoacetophenone type photoradical polymerization initiator | BASF Japan Ltd. | | | | | |
| | | TPO | Acylphosphine oxide type photoradical polymerization initiator | BASF Japan Ltd. | | | | | |
| | | Irgacure 184 | α-hydroxyalkylphenone type photoradical polymerization initiator | BASF Japan Ltd. | | | | | |
| (D) ingredient: Reaction viscous product | | Reaction viscous product obtained in Synthesis Example 1 | | | 1.5 | | | | |
| | | Reaction viscous product obtained in Synthesis Example 2 | | | | | | | |
| | | Reaction viscous product obtained in Synthesis Example 3 | | | | | | | |
| Curing agent which is not reaction viscous product | | DICY50 | Dicyandiamide (median radius: 45 μm) | Mitsubishi Chemical Corporation | | | | | |
| | | 2E4MZ | 2-ethyl-4-methylimidazole | Shikoku Chemicals Corporation | | 1.2 | 2 | | |
| | | C11Z-A | 2,4-diamino-6-[2′-undecylimidazoryl-(1′)]-ethyl-s-triazine | Shikoku Chemicals Corporation | | | | 1 | 1 |
| Evaluation | (1) Viscosity | | | | D | D | D | D | D |
| | (2) Inkjet dischargeability | | | | X | ○ | X | ○ | X |
| | (3) Wet spreading | | | | ○ | ○ | ○ | ○ | ○ |
| | (4) Storage stability | | | | — | X | — | — | — |
| | (5) Heat resistance | | | | — | ○ | — | X | — |
| | (6) Insulation reliability (Migration resistance/Insulation resistance) (×10¹⁰ Ω) | | | | — | 0.52 | — | 2 × 10⁻³ | — |

TABLE 3

| | Product number | | Manufacturer | EX. 9 | EX. 10 | EX. 11 | EX. 12 | EX. 13 | EX. 14 | EX. 15 | EX. 16 |
|---|---|---|---|---|---|---|---|---|---|---|---|
| Blending ingredient (part by weight) | (C) ingredient | YD-127 Bisphenol A type epoxy resin | NIPPON STEEL CHEMICAL Co., Ltd. | 20 | 20 | 15 | 20 | 15 | 20 | 20 | 20 |
| | | YDF-170 Bisphenol F type epoxy resin | NIPPON STEEL CHEMICAL Co., Ltd. | 80 | 80 | | 80 | | 80 | 80 | 80 |
| | | EX-211 Neopentyl glycol diglycidyl ether | Nagase ChemteX Corporation | | | | | | | | |
| | (A) ingredient | TMPTA Trimethylol propane triacrylate | DAICEL-CYTEC Company, Ltd. | | | 85 | | 85 | | | |
| | | IRR214-K Tricyclodecane dimethanol diacrylate | DAICEL-CYTEC Company, Ltd. | | | | | | | | |
| | (B) ingredient | Irgacure 907 α-aminoacetophenone type photoradical polymerization initiator | BASF Japan Ltd. | 5 | 5 | 5 | 5 | 5 | | | |
| | | Irgacure 369 α-aminoacetophenone type photoradical polymerization initiator | BASF Japan Ltd. | | | | | | | | |
| | | Irgacure 379EG α-aminoacetophenone type photoradical polymerization initiator | BASF Japan Ltd. | | | | | | 5 | | |
| | | TPO Acylphosphine oxide type photoradical polymerization initiator | BASF Japan Ltd. | | | | | | | 5 | |
| | | Irgacure 184 α-hydroxyalkylphenone type photoradical polymerization initiator | BASF Japan Ltd. | | | | | | | | 5 |
| | (D) ingredient: Reaction viscous product | Reaction viscous product obtained in Synthesis Example 1 | | | 6 | 6 | | | | | |
| | | Reaction viscous product obtained in Synthesis Example 2 | | | | | 6 | 6 | | | |
| | | Reaction viscous product obtained in Synthesis Example 3 | | | | | | | | | |
| | Curing agent which is not reaction viscous product | DICY50 Dicyandiamide (median radius: 45 μm) | Mitsubishi Chemical Corporation | 4 | | | | | 4 | 4 | 4 |
| | | 2E4MZ 2-ethyl-4-methylimidazole | Shikoku Chemicals Corporation | | | | | | | | |
| | | C11Z-A 2,4-diamino-6-[2'-undecylimidazoryl-(1')-ethyl-s-triazine | Shikoku Chemicals Corporation | | | | | | | | |
| Evaluation | (1) Viscosity | | | D | D | D | D | D | D | D | D |
| | (2) Inkjet dischargeability | | | ○ | ○ | ○ | ○ | ○ | ○ | ○ | ○ |
| | (3) Wet spreading | | | ○ | ○ | ○ | ○ | ○ | ○ | ○ | ○ |
| | (4) Storage stability | | | ○ | ○ | ○ | ○ | ○ | ○ | ○ | ○ |
| | (5) Heat resistance | | | ○ | ○ | ○ | ○ | ○ | ○ | ○ | ○ |
| | (6) Insulation reliability (Migration resistance/Insulation resistance) (× $10^{10}$ Ω) | | | 34 | 22 | 31 | 20 | 28 | 34 | *1 | *1 |

In the curable compositions of Examples 1 to 14 in which an α-aminoacetophenone type photopolymerization initiator was used, stickiness of the surface of the primary cured product after light irradiation and before curing was smaller, heat curability at the time of heat curing was more excellent, and the evaluation result of insulation reliability was better, in comparison with the curable compositions of Examples 15 and 16 in which a photopolymerization initiator other than an α-aminoacetophenone type photopolymerization initiator was used.

In Examples 17 to 40, materials shown in the following Table 4 were appropriately used.

TABLE 4

| Multifunctional compound (A) | Tricyclodecane dimethanol diacrylate<br>Tricyclodecane dimethanol dimethacrylate<br>CN104 (available from Sartomer)<br>Bisphenol A type epoxyacrylate compound<br>1,6-hexanediol diacrylate<br>Triethylene glycol diacrylate |
|---|---|
| Monofunctional compound (E) | Isobornyl acrylate<br>Dihydroxycyclopentadienyl acrylate<br>Dicyclopentenyl acrylate<br>Dicyclopentenyloxyethyl acrylate<br>Isobornyl methacrylate<br>Dihydroxycyclopentadienyl methacrylate<br>Dicyclopentenyl methacrylate<br>Dicyclopentenyloxyethyl methacrylate<br>Dicyclopentanyl methacrylate<br>2-(2-ethoxyethoxy)ethyl acrylate<br>Lauryl acrylate |
| Photo polymerization initiator (B) | Irgacure 369 (BASF Japan Ltd.)<br>α-aminoalkylphenone type photoradical polymerization initiator having a dimethylamino group |
| Compound having a cyclic ether group (C) | jER827 (available from Mitsubishi Chemical Corporation) Bisphenol A type epoxy compound |
| Curing agent (D) | Reaction viscous product obtained in Synthesis Example 1<br>Reaction viscous product obtained in Synthesis Example 2<br>Reaction viscous product obtained in Synthesis Example 3 |

EXAMPLE 17

65 parts by weight of tricyclodecane dimethanol diacrylate corresponding to the polyfunctional compound (A), 30 parts by weight of isobornyl acrylate corresponding to the monofunctional compound (E) and 5 parts by weight of Irgacure 907 (α-aminoacetophenone type photoradical polymerization initiator, available from BASF Japan Ltd.) corresponding to the photopolymerization initiator (B) were mixed, to obtain a curable composition for inkjet.

EXAMPLES 18 TO 40

Curable compositions for inkjet were obtained in a similar manner to Example 17 except that the kinds of ingredients and the blending amounts were changed as shown in the following Tables 5 and 6.

In the curable compositions for inkjet obtained in Examples 17 to 40, the reaction viscous product was compatible with the polyfunctional compound, compatible with the monofunctional compound, and compatible with the compound having a cyclic ether group, and further was dissolved in the curable composition.

EVALUATION OF EXAMPLES 17 to 40

For Examples 17 to 40, evaluation was made for similar evaluation items for Examples 1 to 16 and Comparative Examples 1 to 5. Regarding the evaluation of insulation reliability (migration resistance), insulation resistance was judged according to the following criteria, and the results are shown in the following Tables 5 and 6.

[Judging Criteria of Insulation Reliability]
○: Insulation resistance is $3\times10^{10}$ Ω or more
Δ: Insulation resistance is $1\times10^9$ or more and less than $3\times10^{10}$
x: Insulation resistance is less than $1\times10^9$ Further, in Examples 17 to 40, also evaluation of moist heat resistance as will be described later was conducted.

(7) Moist Heat Resistance (Heat Resistance and Moisture Resistance)

A glass epoxy substrate (100 mm×100 mm) having copper wiring provided on its top face was prepared. On the entire surface of this substrate, a curable composition for inkjet discharged from an inkjet head of a piezo type inkjet printer equipped with a UV illuminator was applied. At the time of conducting the discharge test for a curable composition having a viscosity of 500 mPa·s or less, the head temperature was set at 80° C., and at the time of conducting the discharge test for a curable composition having a viscosity of more than 500 mPa·s, the head temperature was set at 95° C.

The curable composition for inkjet (thickness 20 μm) applied on the substrate was irradiated with an ultraviolet ray having a wavelength of 365 nm so that the irradiation energy was 1000 mJ/cm$^2$, and then heated at 180° C. for 1 hour, to obtain a cured product (thickness 20 μm).

The obtained laminate of the substrate and the cured product was left still for 24 hours in the condition of 130° C. and relative humidity of 85% RH. Then adhesiveness of the cured product to the substrate was examined by a crosscut tape test (JIS 5400 6.15), and moist heat resistance was judged according to the following judging criteria. In the cured product, cuts were made at intervals of 1 mm by means of a cutter to form a grid of 100 cells, and cellophane tape (JIS Z1522) was put onto the cured product having cuts, and one end of the tape was strongly peeled off at an angle of 45 degrees, and the peeling condition was checked.

[Judging Criteria of Moist Heat Resistance]
○○: The cured product did not peel off when the tape was peeled off.
○: The cured product partly peeled off when the tape was peeled off.
Δ: The cured product wholly peeled off when the tape was peeled off.
x: The cured product peeled off before the tape was peeled off.

The results are shown in the following Tables 5 and 6.

TABLE 5

| | | | EX. 17 | EX. 18 | EX. 19 | EX. 20 | EX. 21 | EX. 22 | EX. 23 | EX. 24 | EX. 25 | EX. 26 | EX. 27 | EX. 28 | EX. 29 |
|---|---|---|---|---|---|---|---|---|---|---|---|---|---|---|---|
| Blending ingredient (part by weight) | (A) ingredient | Tricyclodecane dimethanol diacrylate | 65 | 70 | 20 | 25 | 65 | 45 | 40 | | 65 | 65 | 65 | 65 | 65 |
| | | Tricyclodecane dimethanol dimethacrylate | | | | | | | | 65 | | | | | |

TABLE 5-continued

| | | | EX. 17 | EX. 18 | EX. 19 | EX. 20 | EX. 21 | EX. 22 | EX. 23 | EX. 24 | EX. 25 | EX. 26 | EX. 27 | EX. 28 | EX. 29 |
|---|---|---|---|---|---|---|---|---|---|---|---|---|---|---|---|
| | | CN104 | | | | | | 35 | 30 | | | | | | |
| | | 1,6-hexanediol diacrylate | | | 30 | 20 | 25 | | | | | | | | |
| | | Triethylene glycol diacrylate | | | | | | | | | | | | | |
| | (E) ingredient | Isobornyl acrylate | 30 | 25 | 45 | 50 | 5 | 15 | 15 | 30 | | | | | |
| | | Dihydroxycyclo-pentadienyl acrylate | | | | | | | | | 30 | | | | |
| | | Dicyclopentenyl acrylate | | | | | | | | | | 30 | | | |
| | | Dicyclopentenyl-oxyethyl acrylate | | | | | | | | | | | 30 | | |
| | | Isobornyl methacrylate | | | | | | | | | | | | 30 | |
| | | Dihydroxycyclopenta-dienyl methacrylate | | | | | | | | | | | | | 30 |
| | | Dicyclopentenyl methacrylate | | | | | | | | | | | | | |
| | | Dicyclopentenyloxyethyl methacrylate | | | | | | | | | | | | | |
| | | Dicyclopentanyl methacrylate | | | | | | | | | | | | | |
| | | 2-(2-ethoxyethoxy)ethyl acrylate | | | | | | | | | | | | | |
| | | Lauryl acrylate | | | | | | | | | | | | | |
| | (B) ingredient | Irgacure 369 | 5 | 5 | 5 | 5 | 5 | 5 | 4 | 5 | 5 | 5 | 5 | 5 | 5 |
| | (C) ingredient | jER827 | 10 | 10 | 10 | 10 | 10 | 10 | 10 | 10 | 10 | 10 | 10 | 10 | 10 |
| | (D) ingredient: Reaction viscous product | Reaction viscous product obtained in Synthesis Example 1 | 1 | 1 | 1 | 1 | 1 | 1 | 1 | 1 | 1 | 1 | 1 | 1 | 1 |
| | | Reaction viscous product obtained in Synthesis Example 2 | | | | | | | | | | | | | |
| | | Reaction viscous product obtained in Synthesis Example 3 | | | | | | | | | | | | | |
| Evaluation | (1) Viscosity | | D | D | D | D | D | D | D | D | D | D | D | D | D |
| | (2) Inkjet dischargeability | | ○○ | ○○ | ○○ | ○○ | ○○ | ○○ | ○○ | ○○ | ○○ | ○○ | ○○ | ○○ | ○○ |
| | (3) Wet spreading | | ○ | ○ | ○ | ○ | ○ | ○ | ○ | ○ | ○ | ○ | ○ | ○ | ○ |
| | (4) Storage stability | | ○ | ○ | ○ | ○ | ○ | ○ | ○ | ○ | ○ | ○ | ○ | ○ | ○ |
| | (5) Heat resistance | | ○ | ○ | ○ | ○ | ○ | ○ | ○ | ○ | ○ | ○ | ○ | ○ | ○ |
| | (6) Insulation reliability (Migration resistance/Insulation resistance) | | ○ | ○ | ○ | ○ | ○ | ○ | ○ | ○ | ○ | ○ | ○ | ○ | ○ |
| | (7) Moist heat resistance | | ○○ | ○○ | ○○ | ○○ | ○○ | ○○ | ○○ | ○○ | ○○ | ○○ | ○○ | ○○ | ○○ |

TABLE 6

| | | | EX. 30 | EX. 31 | EX. 32 | EX. 33 | EX. 34 | EX. 35 | EX. 36 | EX. 37 | EX. 38 | EX. 39 | EX. 40 |
|---|---|---|---|---|---|---|---|---|---|---|---|---|---|
| Blending ingredient (part by weight) | (A) ingredient | Tricyclodecane dimethanol diacrylate | 65 | 65 | 65 | 65 | 65 | 75 | 15 | 25 | 65 | 65 | 65 |
| | | Tricyclodecane dimethanol dimethacrylate | | | | | | | | | | | |
| | | CN104 | | | | | | | | | | | |
| | | 1,6-hexanediol diacrylate | | | | | | | | | 35 | 15 | 27 |
| | | Triethylene glycol diacrylate | | | | | | | | | | | |
| | (E) ingredient | Isobornyl acrylate | 30 | 30 | | | | 20 | 45 | 55 | 3 | | |
| | | Dihydroxycyclopentadienyl acrylate | | | | | | | | | | | |
| | | Dicyclopentenyl acrylate | | | | | | | | | | | |
| | | Dicyclopentenyloxyethyl acrylate | | | | | | | | | | | |
| | | Isobornyl methacrylate | | | | | | | | | | | |
| | | Dihydroxycyclopentadienyl methacrylate | | | | | | | | | | | |
| | | Dicyclopentenyl methacrylate | | | 30 | | | | | | | | |
| | | Dicyclopentenyloxyethyl methacrylate | | | | 30 | | | | | | | |
| | | Dicyclopentanyl methacrylate | | | | | 30 | | | | | | |
| | | 2-(2-ethoxyethoxy)ethyl acrylate | | | | | | | | | | 30 | |
| | | Lauryl acrylate | | | | | | | | | | | 30 |
| | (B) ingredient | Irgacure 369 | 5 | 5 | 5 | 5 | 5 | 5 | 5 | 5 | 5 | 5 | 5 |
| | (C) ingredient | jER827 | 10 | 10 | 10 | 10 | 10 | 10 | 10 | 10 | 10 | 10 | 10 |
| | (D) ingredient: Reaction viscous product | Reaction viscous product obtained in Synthesis Example 1 | | | | 1 | 1 | 1 | 1 | 1 | 1 | 1 | 1 |
| | | Reaction viscous product obtained in Synthesis Example 2 | 1 | | | | | | | | | | |
| | | Reaction viscous product obtained in Synthesis Example 3 | | 1 | | | | | | | | | |

TABLE 6-continued

| | | EX. 30 | EX. 31 | EX. 32 | EX. 33 | EX. 34 | EX. 35 | EX. 36 | EX. 37 | EX. 38 | EX. 39 | EX. 40 |
|---|---|---|---|---|---|---|---|---|---|---|---|---|
| Evaluation | (1) Viscosity | D | D | D | D | D | D | D | D | D | D | D |
| | (2) Inkjet dischargeability | ⊙○ | ⊙○ | ⊙○ | ⊙○ | ⊙○ | ⊙○ | ⊙○ | ⊙○ | ⊙○ | ⊙○ | ⊙○ |
| | (3) Wet spreading | ○ | ○ | ○ | ○ | ○ | ○ | ○ | ○ | ○ | ○ | ○ |
| | (4) Storage stability | ○ | ○ | ○ | ○ | ○ | ○ | ○ | ○ | ○ | ○ | ○ |
| | (5) Heat resistance | ○ | ○ | ○ | ○ | ○ | ○ | ○ | ○ | ○ | ○ | ○ |
| | (6) Insulation reliability (Migration resistance/Insulation resistance) | ○ | ○ | ○ | ○ | ○ | ○ | ○ | ○ | ○ | ○ | ○ |
| | (7) Moist heat resistance | ⊙○ | ⊙○ | ⊙○ | ⊙○ | ⊙○ | ○ | ⊙○ | ⊙○ | ○ | Δ | Δ |

The invention claimed is:

1. A curable composition for inkjet that is applied by an inkjet method and is curable by light irradiation and heat addition, comprising:
 a compound having a cyclic ether group,
 a curing agent,
 a multifunctional compound having two or more (meth)acryloyl groups, and
 a photopolymerization initiator,
 wherein the curing agent is a reaction viscous product obtained by reacting dicyandiamide with a compound having an epoxy group, and
 the reaction viscous product is dissolved in the curable composition,
 wherein (1) the curable composition further comprises a monofunctional compound having a polycyclic backbone and one (meth)acryloyl group, the monofunctional compound being at least one selected from the group consisting of isobornyl (meth)acrylate, dicyclopentanyl (meth)acrylate, dicyclopentenyloxyethyl (meth)acrylate and dicyclopentanyl (meth)acrylate, or (2) the multifunctional compound having two or more (meth)acryloyl groups includes a first multifunctional compound having a polycyclic backbone and two or more (meth)acryloyl groups, the first multifunctional compound being tricyclodecane dimethanol di(meth)acrylate.

2. The curable composition for inkjet according to claim 1, wherein the compound having an epoxy group that reacts with the dicyandiamide has one epoxy group.

3. The curable composition for inkjet according to claim 1, wherein the compound having an epoxy group that reacts with the dicyandiamide has an aromatic backbone.

4. The curable composition for inkjet according to claim 1, wherein the reaction viscous product is a reaction viscous product obtained by reacting 1 mol or more and 3 mol or less of the compound having an epoxy group with 1 mol of dicyandiamide.

5. The curable composition for inkjet according to claim 1, wherein the dicyandiamide reacted with the compound having an epoxy group is in a powdered state.

6. The curable composition for inkjet according to claim 1, wherein the photopolymerization initiator is an α-aminoalkylphenone type photoradical polymerization initiator.

7. The curable composition for inkjet according to claim 1, wherein the photopolymerization initiator is an α-aminoalkylphenone type photoradical polymerization initiator having a dimethylamino group.

8. The curable composition for inkjet according to claim 1, wherein:
 the curable composition comprises the monofunctional compound having a polycyclic backbone and one (meth)acryloyl group.

9. The curable composition for inkjet according to claim 1, wherein:
 the curable composition comprises the monofunctional compound having a polycyclic backbone and one (meth)acryloyl group, and
 the multifunctional compound having two or more (meth)acryloyl groups includes the first multifunctional compound having a polycyclic backbone and two or more (meth)acryloyl groups.

10. The curable composition for inkjet according to claim 9, wherein in a total of 100% by weight of the multifunctional compound, the monofunctional compound and the photopolymerization initiator, the content of the multifunctional compound is 20% by weight or more and 70% by weight or less, and the content of the monofunctional compound is 5% by weight or more and 50% by weight or less.

11. The curable composition for inkjet according to claim 1, wherein the reaction viscous product is a product obtained by reacting an epoxy group of the compound having an epoxy group with part of active hydrogen in dicyandiamide.

12. The curable composition for inkjet according to claim 1, wherein a viscosity of the curable composition at 25° C. measured in conformance with JIS K2283 is 160 mPa·s or more and 1200 mPa·s or less.

13. The curable composition for inkjet according to claim 1, wherein the compound having a cyclic ether group has two or more epoxy groups.

14. A method for producing an electronic component comprising the steps of:
 applying the curable composition for inkjet according to claim 1 by an inkjet method to draw a pattern, and
 making the curable composition for inkjet drawn into a pattern cure by heat addition, to form a cured product layer.

15. The method for producing an electronic component according to claim 14, for producing a printed wiring board which is an electronic component having a resist pattern,
 wherein the curable composition for inkjet is applied by an inkjet method to draw in a pattern, and the curable composition for inkjet drawn in a pattern is made to cure by heat addition, to form a resist pattern.

16. The method for producing an electronic component according to claim 14,
wherein,
in the step of forming the cured product layer, the curable composition for inkjet drawn into a pattern is made to cure by light irradiation and heat addition, to form a cured product layer.

* * * * *